(12) United States Patent  
Hakii

(10) Patent No.: US 8,030,648 B2
(45) Date of Patent: Oct. 4, 2011

(54) ORGANIC THIN FILM TRANSISTOR AND ORGANIC THIN FILM TRANSISTOR MANUFACTURING PROCESS

(75) Inventor: Takeshi Hakii, Sagamihara (JP)

(73) Assignee: Konica Minolta Holdings, Inc., Tokyo (JP)

( * ) Notice: Subject to any disclaimer, the term of this patent is extended or adjusted under 35 U.S.C. 154(b) by 139 days.

(21) Appl. No.: 12/449,568

(22) PCT Filed: Jan. 30, 2008

(86) PCT No.: PCT/JP2008/051371
§ 371 (c)(1),
(2), (4) Date: Aug. 13, 2009

(87) PCT Pub. No.: WO2008/102619
PCT Pub. Date: Aug. 28, 2008

(65) Prior Publication Data
US 2010/0025666 A1 Feb. 4, 2010

(30) Foreign Application Priority Data
Feb. 23, 2007 (JP) ................................. 2007-043539

(51) Int. Cl.
*H01L 51/10* (2006.01)
(52) U.S. Cl. .................. 257/40; 257/E51.006; 438/99
(58) Field of Classification Search .................. 257/40, 257/E51.001–E51.052; 438/99
See application file for complete search history.

(56) References Cited

U.S. PATENT DOCUMENTS

| 6,433,359 B1* | 8/2002 | Kelley et al. | 257/40 |
| 2005/0032268 A1* | 2/2005 | Nishikawa et al. | 438/99 |
| 2005/0056828 A1* | 3/2005 | Wada et al. | 257/40 |
| 2007/0063195 A1* | 3/2007 | Kim et al. | 257/40 |
| 2007/0087489 A1* | 4/2007 | Park et al. | 438/149 |

FOREIGN PATENT DOCUMENTS

| JP | 2003-318190 A | 11/2003 |
| JP | 2005-051151 A | 2/2005 |
| JP | 2005-072188 A | 3/2005 |
| JP | 2005-286158 A | 10/2005 |
| JP | 2006-059896 A | 3/2006 |
| JP | 2006-213677 A | 8/2006 |
| JP | 2006-216654 A | 8/2006 |

* cited by examiner

*Primary Examiner* — Matthew W Such
(74) *Attorney, Agent, or Firm* — Holtz, Holtz, Goodman & Chick, PC

(57) ABSTRACT

Disclosed is a stable organic thin film transistor having good switching property and a process for manufacturing an organic thin film transistor by a simple method. The organic thin film transistor comprises a substrate and provided thereon, at least a source electrode, a drain electrode, an organic semiconductor connecting the source electrode and the drain electrode, a gate electrode, and an insulating layer composed of a plurality of layers, the insulating layer being provided between the gate electrode and the organic semiconductor, wherein the organic thin film transistor comprises a mercapto group-containing compound represented by the following formula (I), $$(R)_n\text{—Si}(A)_{3-n}\text{—(B)} \qquad \text{Formula (I)}$$

wherein R represents an alkyl group having a carbon atom number of not more than 8; A represents an alkoxy group or a halogen atom; B represents a substituent containing an SH group; and n is an integer of from 0 to 2.

8 Claims, 1 Drawing Sheet

ORGANIC THIN FILM TRANSISTOR AND ORGANIC THIN FILM TRANSISTOR MANUFACTURING PROCESS

This application is the United States national phase application of International Application PCT/JP2008/051371 filed Jan. 30, 2008.

FIELD OF THE INVENTION

The present invention relates to a stable organic thin film transistor having a good switching property and an organic thin film transistor manufacturing process.

TECHNICAL BACKGROUND

In recent years, an organic thin film transistor (organic TFT, i.e., Organic Thin Film Transistor OTFT) draws attention as a next general flat panel display device with high quality and low price or a switching element for driving pixels of an electronic paper.

An organic thin film transistor has substantially the same structure as a silicon thin film transistor, but is different from a silicon thin film transistor in that it employs an organic substance in the semiconductor active layer. The organic thin film transistor can be manufactured without employing a vacuum apparatus according to an ink jet method or a printing method, and therefore, the organic thin film transistor can be manufactured simply and at low cost as compared with a silicon TFT. The organic thin film transistor has advantages that it is suitably applied to an electronic circuit board which is not broken by impact, and can be bent and folded. An organic thin film transistor having such advantages is useful in the case where an element with a wide area is manufactured, a low temperature manufacturing condition is required or a product with high resistance to folding is required, and is desired as an element for driving a matrix of a large size display or an element for driving an organic EL or an electronic paper. Many companies have developed the organic thin film transistor.

Operation principle of an organic thin film transistor is to control resistance by voltage. The gate voltage being controlled, the insulating layer works to generate an accumulation layer in a carrier in a contact interface between the organic semiconductor layer and the insulating layer, whereby current between the two ohm contacts is controlled.

Conventionally, the source electrode, the drain electrode, the gate electrode, the contact electrode or the pixel electrode of an organic thin film transistor has been formed by a vacuum method such as a sputtering method, resulting in cost increase due to the vacuum method.

In order to solve the above problems, an ink jet method (see Patent Document 1 below) or a screen printing method (see Patent Document 2 below) have been investigated as an electrode formation method without employing a vacuum method.

Techniques disclosed in the Patent Documents described above have been studied in detail. As a result, it has been found that in the method disclosed in the Patent Document 1, in which a source electrode and a drain electrode are formed via an ink jet method, controlling affinity of ink to a substrate, additives in the ink remain in the electrodes, which adversely affects transistor performance.

It has been also found that the method disclosed in the Patent Document 2, which forms a source electrode and a drain electrode via a screen printing method employing a silver paste, does not provide source and drain electrode with high resolution nor a transistor with high speed and low power consumption.

Patent Document 1: Japanese Patent O.P.I. Publication No. 2003-318190
Patent Document 2: Japanese Patent O.P.I. Publication No. 2005-72188

DISCLOSURE OF THE INVENTION

Problems to be Solved by the Invention

The present invention has been made in view of the above. An object of the invention is to provide an organic thin film transistor with high stability and good switching property and a process for manufacturing the organic thin film transistor according to a simple method.

Means for Solving the Above Problems

The above object of the invention can be attained by the following constitutions.

1. An organic thin film transistor comprising a substrate and provided thereon, at least a source electrode, a drain electrode, an organic semiconductor connecting the source electrode and the drain electrode, a gate electrode, and an insulating layer composed of a plurality of layers, the insulating layer being provided between the gate electrode and the organic semiconductor, wherein the organic thin film transistor comprises a mercapto group-containing compound represented by the following formula (I).

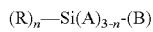   Formula (I)

wherein R represents an alkyl group having a carbon atom number of not more than 8; A represents an alkoxy group or a halogen atom; B represents a substituent containing an SH group; and n is an integer of from 0 to 2.

2. The organic thin film transistor of item 1 above, wherein the mercapto group-containing compound represented by formula (I) above has a triazine ring.

3. The organic thin film transistor of item 1 or 2 above, wherein at least one electrode selected from a pixel electrode, the source electrode, the drain electrode, the gate electrode and a contact electrode is formed from a layer composed of the mercapto group-containing compound represented by formula (I) above and a layer composed of a metal.

4. The organic thin film transistor of any one of items 1 through 3 above, wherein the organic semiconductor contains a compound represented by formula (1).

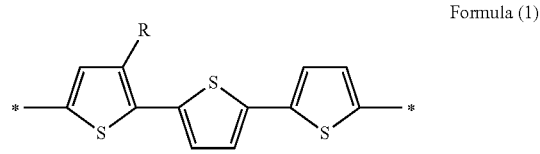   Formula (1)

wherein R represents a substituent.

5. An organic thin film transistor manufacturing process for manufacturing the organic thin film transistor of any one of items 1 through 4 above, the process comprising bringing a base material into contact with a solution of a mercapto group-containing compound represented by the following formula (I), so that the mercapto group-containing compound represented by formula (I) combines with the base material through a siloxane bond.

$$(R)_n\text{—}Si(A)_{3-n}\text{-}(B) \qquad \text{Formula (I)}$$

wherein R represents an alkyl group having a carbon atom number of not more than 8; A represents an alkoxy group or a halogen atom; B represents a substituent containing an SH group; and n is an integer of from 0 to 2.

6. The organic thin film transistor manufacturing process of item 5 above, the process comprising exposing to light a layer containing the mercapto group-containing compound represented by formula (I), whereby areas capable of combining with a metal and areas incapable of combining with a metal are formed to separate from each other.

7. The organic thin film transistor manufacturing process of item 6 above, wherein the areas capable of combining with a metal have on the surface an —SH group, and the areas incapable of combining with a metal have on the surface an —S—S— bond.

8. The organic thin film transistor manufacturing process of any one of items 5 through 7 above, the process comprising bringing the exposed layer into contact with a solution containing a metal, to combine the metal with the areas capable of combining with a metal.

9. The organic thin film transistor manufacturing process of any one of items 5 through 8 above, the process comprising bringing the exposed layer into contact with a solution containing a metal, followed by plating treatment, whereby a plating film is formed at exposed portions.

10. An organic thin film transistor manufactured according to the organic thin film transistor manufacturing process of any one of items 5 through 9 above.

Effects of the Invention

The present invention can provide an organic thin film transistor with a good switching property and good stability and a process for manufacturing the organic thin film transistor according to a simple method.

EXPLANATION OF THE NUMERICAL NUMBERS

Figure 1:
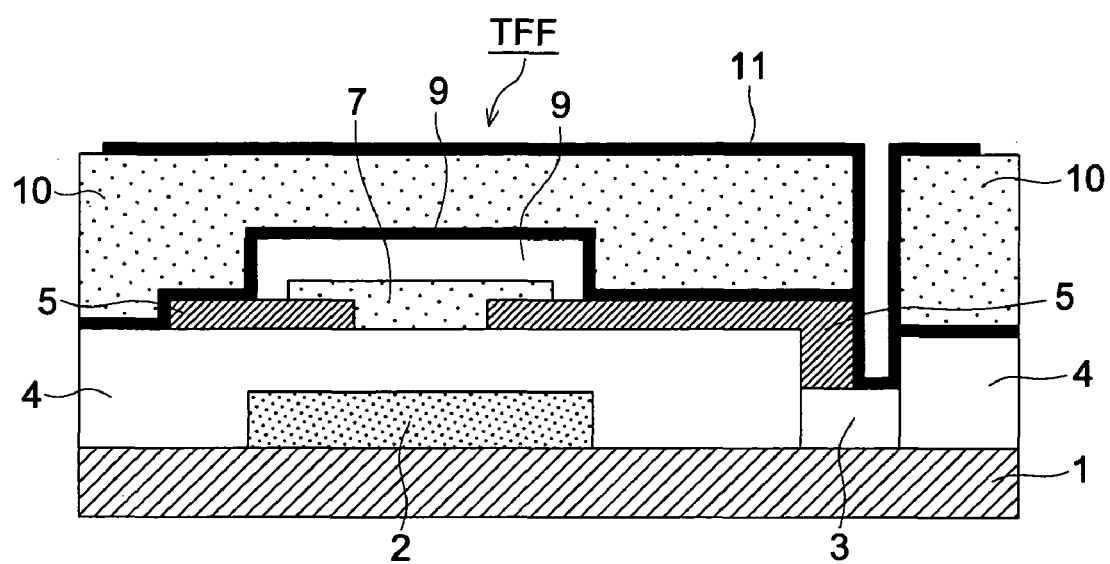
FIG. 1 is a sectional view showing one embodiment of a structure of the organic thin film transistor of the invention.

1: Substrate
2: Gate electrode
3: Contact electrode
4: Insulating layer
5: Source electrode
6: Drain electrode
7: Organic semiconductor layer
8, 9: Passivation layer
10: Light sensitive insulating layer

PREFERRED EMBODIMENT OF THE INVENTION

Next, preferred embodiments of the invention will be explained in detail.

In view of the above, extensive study has been made in order to solve the above problems. As a result, the present inventor has found that an organic thin film transistor can be manufactured according to a simple method and can provide good switching property and good stability, which comprises a substrate and provided thereon, at least a source electrode, a drain electrode, an organic semiconductor connecting the source electrode and the drain electrode, a gate electrode, and an insulating layer composed of a plurality of layers, the insulating layer being provided between the gate electrode and the organic semiconductor, wherein the organic thin film transistor comprises a mercapto group-containing compound represented by the following formula (I), and completed the invention.

Next, the present invention will be explained in detail.

In the organic thin film transistor of the invention, the organic thin film transistor is characterized in that it comprises a mercapto group-containing compound represented by formula I.

A method will be explained in detail below, which forms a pixel electrode, a source electrode, a drain electrode, a gate electrode or a contact electrode employing a mercapto group-containing compound represented by formula (I).

[Compound Represented by Formula (I)]

A mercapto group-containing compound represented by the following formula (I) will be explained.

$$(R)_n\text{—}Si(A)_{3-n}\text{-}(B) \qquad \text{Formula (I)}$$

In formula (I) above, R is an alkyl group having a carbon atom number of not more than 8, and is preferably a lower alkyl group having a carbon atom number of from 1 to 4; n is an integer of from 0 to 2; A represents an alkoxy group or a halogen atom; examples of the alkoxy group include a lower alkoxy group (having a carbon atom number of from 1 to 4) such as a methoxy group, an ethoxy group, a propoxy group or a butoxy group, and the alkoxy group is preferably a methoxy group or an ethoxy group; and B represents a substituent containing an SH group. Although B is not specifically limited, B may be any as long as it is an aliphatic or (hetero) aromatic-group containing at least one mercapto group and preferably at least two mercapto groups. Examples of the aliphatic group include a lower alkyl group such as ethyl, propyl or butyl, and examples of the aromatic group include a triazine ring.

Examples thereof include the following compounds.
(A-1) Triethoxysilyl-propylamino-triazine-dithiol
(A-2) γ-Mercaptopropyl-trimethoxysilane
(A-3) 3-Mercaptopropylmethyldimethoxysilane
(A-4) Mercaptopropyltriethoxysilane
(A-5) γ-Mercaptopropylmethyldimethoxysilane
(A-6) γ-Mercaptopropyltrichlorosilane Among compounds represented by formula (I) above, a compound having a triazine ring is especially preferred. For example, (A-1) triethoxysilyl-propylamino-triazine-diol can be easily prepared by condensation reaction of γ-propyltriethoxysilane with a corresponding mercaptoamine, in this case, 1-amino-3,5-dimercaptotriazine (as disclosed in Japanese Patent O.P.I. Publication No. 2001-316872).

[Method of Forming Electrode Employing a Mercapto Group-containing Compound Represented by Formula (I)]

In the invention, it is preferred that at least one electrode selected from a pixel electrode, a source electrode, a drain electrode, a gate electrode and a contact electrode is formed from a layer composed of a mercapto group-containing compound represented by formula (I) in the invention and a layer composed of a metal.

The organic thin film transistor manufacturing process of the invention is characterized in that the process comprises bringing a base material into contact with a solution of a mercapto group-containing compound represented by the following formula (I), whereby the mercapto group-containing compound represented by formula (I) combines with the base material through a siloxane bond.

A solvent used in a solution containing a mercapto group-containing compound represented by formula (I) may be any solvent such as water, a water based solvent or an organic solvent, as long as it dissolves the mercapto group-containing compound represented by formula (I). As the solvent, an alcoholic solvent is preferred, and ethanol or isopropanol is more preferred in view of handling and drying properties.

As a pre-processing method of an electrode to be brought into contact with a solution containing a mercapto group-containing compound represented by formula (I), there is mentioned a known processing method such as cleaning by alcohol, cleaning by an acid or alkaline solution, cleaning by a surfactant solution, an atmospheric pressure plasma treatment or UV/ozone treatment. The pre-processing method is preferably a method in which cleaning by an alkaline solution, which is followed by or UV/ozone treatment, is carried out.

It is preferred that the organic thin film transistor manufacturing process of the invention comprises subjecting to light exposure a layer containing the mercapto group-containing compound represented by formula (I), whereby areas capable of combining with a metal and areas incapable of combining with a metal are formed to separate from each other. It is preferred that the areas capable of combining with a metal has on the surface an —SH group and the areas incapable of combining with a metal has on the surface an —S—S— bond. It is preferred that the layer subjected to light exposure is brought into contact with a solution containing a metal to combine the metal with the areas capable of combining with a metal. It is preferred that the layer subjected to light exposure is brought into contact with a solution containing a metal, followed by plating treatment to selectively form a plating film at exposed portions.

That is; it is preferred that the organic thin film transistor manufacturing process of the invention comprises subjecting to light exposure a base material (base board), with which the mercapto group-containing compound represented by formula (I) combines, whereby areas capable of combining with a metal and areas in capable of combining with a metal are formed to separate from each other.

The base material (base board) herein referred to may be any material as long as it is a base material (base board) having on the surface a group capable of reacting with alkoxysilanes and of combining with them through a siloxane bond (Si—O), for example, a group such as a hydroxyl group. For example, the base material may have on the surface a layer having a group such as a hydroxyl group reacting with the alkoxysilanes or the base material itself may have a surface having such a property. Examples thereof include a base material (base board) such as an electrode having a layer composed of a metal oxide (for example, a metal oxide such as silicon oxide).

The surface may be a surface hydrophilized by processing the surface of a metal film or a resin film with an alkali solution having a high pH to hydrolyze a part of the surface or by ozone treating the surface. When the alkali solution is used in the above, the pH of the alkali solution is preferably of from 5 to 12. Further, the surface may be a surface composed of metal oxides and the like alkali processed to form a surface with increased hydroxyl groups.

These surfaces described above are combined with the mercapto group-containing compound represented by formula (I) in the invention and exposed to light, whereby areas capable of combining with a metal and areas incapable of combining with a metal are formed separately from each other. The light exposure is preferably carried out employing a UV light. It is supposed that the UV light exposure changes the SH group of the compound represented by formula (I) to —S—S— to eliminate a site combining with a metal from the surface, whereby the respective areas are separated from each other. The separation of exposed portions from unexposed portions may be carried out by light exposure through a photomask or by pattern exposure employing a scanning laser light.

The organic thin film transistor manufacturing process of the invention is characterized in that a metal containing solution is brought into contact with the base material after the light exposure, whereby the metal is combined with areas capable of combining with a metal. The metal containing solution may be any solution as long as it is a solution, in which a metal ion is dissolved, and is preferably a solution containing gold, silver, copper, chromium or palladium.

In the organic thin film transistor manufacturing process of the invention, a method is one of the preferred embodiments in which the base material having a metal combining with areas capable of combining with a metal is subjected to plating treatment, whereby a plating film is selectively formed at exposed areas. In this plating treatment, plating can be carried out at areas selectively separated by light exposure to be plated which can eliminate troublesome treatments such as photolithography necessary to form a plate pattern and can form a plate pattern simply and in a short time. An anchor combines with the base material through an —O—Si group, which can provide a plating film with good adhesion strength.

According to the method as described above, a metal electrode with an intended pattern can be prepared according to plating treatment.

[Constitution of Organic Thin Film Transistor]

Next, each of the components constituting the organic thin film transistor of the invention will be explained in detail.

FIG. 1 is a sectional view showing one embodiment of a structure of the organic thin film-transistor of the invention.

In FIG. 1, the organic thin film transistor TFT is comprised of a substrate 1, a gate electrode 2, a contact electrode 3, a source electrode 5, a drain electrode 6, and an organic semiconductor layer 7. The gate electrode 2 is provided on the substrate 1, and an insulating layer 4 including a gate insulating layer is provided to cover the gate electrode 2. A space forming a channel of the organic semiconductor layer 7, the source electrode 5 and the drain electrode 6 are provided on the insulating layer 4. The organic semiconductor layer 7 is formed at the space between the source electrode 5 and the drain electrode 6 to connect the source and drain electrodes.

Next, constitution, material and process of each component constituting the organic thin film transistor will be explained.

The substrate 1 is not specifically limited, and glass or a resin sheet such as a flexible plastic film can be employed as the substrate. Typical examples of the plastic film include polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of such a plastic film makes it possible to decrease weight, to enhance portability, and to enhance durability against impact due to its flexibility, as compared to glass.

A material for the gate electrode 2 or the contact electrode 3 is not specifically limited as long as it is a conductive material and is preferably a material with a sufficient conductivity. Examples thereof include Al, Cr, Ag, Mo and those subjected to doping.

In order to form a gate electrode 2 or a contact electrode 3, it is necessary to form a conductive layer on a substrate 1. As a method for forming this conductive layer, there is, for example, a known vapor deposition or sputtering method which is carried out employing the materials described above. Thereafter, known photolithography treatment (coating, exposing and development of resist) and etching treatment are conducted to form a gate electrode 2.

As another method for forming a gate electrode 2 or a contact electrode 3, there is an ink jet method or a printing method such as letter press printing, intaglio printing or screen printing carried out employing fluid electrode materials.

As a conductive particle dispersion, there is a conductive particle dispersion such as a paste or ink in which conductive particles comprised of metals etc. are dispersed in water, an organic solvent or their mixture preferably in the presence of a dispersion stabilizer of an organic material. In the dispersion as described above, a dispersion medium containing water mainly as is preferred, since the conductive layer is formed on an organic semiconductor layer.

Examples of metal materials (metal particles) for the conductive particles include platinum, gold, silver, cobalt, nickel, chromium, copper, iron, tin, antimony lead, tantalum, indium, palladium, tellurium, rhenium, iridium, aluminum, ruthenium, germanium, molybdenum, tungsten and zinc. Platinum, gold, silver, copper, cobalt, chromium, indium, nickel, palladium, molybdenum, and tungsten, each having a work function of not less than 4.5 eV, are especially preferred.

Further, there can preferably be utilized conductive polymers known in the art with electric conductivity enhanced via doping such as conductive polyaniline, conductive polypyrrole, conductive polythiophene or a complex (PEDOT/PSS) of polyethylenedioxy thiophene and polystyrene sulfonic acid. Among the above, those are preferred which exhibit low electrical resistance in the interface to be in contact with the semiconductor layer.

A preferred method for forming a gate electrode 2 or a contact electrode 3 is a plating treatment method conducted employing a compound represented by formula (I) in the invention.

A source electrode 5, a drain electrode 6 or a pixel electrode can be formed in the same manner as described above in the gate electrode.

Materials constituting an organic semiconductor layer 7 are not specifically limited and examples thereof include various condensed polycyclic aromatic compounds or conjugated compounds.

Examples of the condensed polycyclic aromatic compounds include compounds such as anthracene, tetracene, pentacene, hexacene, heptacene, phthalocyanine and porphyrin, and their derivatives or mixtures.

Examples of the conjugated compounds include polythiophene and oligomers thereof, polypyrrole and oligomers thereof, polyaniline, polyphenylene and oligomers thereof, polyphenylene vinylene (PPV) and oligomers thereof, polyethylene vinylene and oligomers thereof, polyacetylene, polydiacetylene, tetrathiafluvalene compounds, quinone compounds, cyano compounds such as tetracyanoquinodimethane, and fullerene, and their derivatives or mixtures.

In the organic thin film transistor of the invention, an organic semiconductor material for an organic semiconductor layer 7 is preferably an oligomer having an average molecular weight of 5,000 or less, and as an oligomer preferably used in the invention, there is mentioned a thiophene oligomer.

The thiophene oligomer-preferably used in the invention is a thiophene oligomer which contains two or more continuous substituted thiophene ring repeating units and two or more continuous unsubstituted thiophene ring repeating units, and has a total thiophene ring number of from 8 to 40. The total thiophene ring number of the thiophene oligomer is preferably from 8 to 20.

In the invention, the thiophene oligomer is preferably a compound comprising a partial structure represented by formula (1) described previously.

Examples of the substituent represented by R in formula (1) include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aryl group (for example, a phenyl group, a p-chlorophenyl group, a mesityl group, a tolyl group, a xylyl group, a naphthyl group, an anthoryl group, an azulenyl group, an acenaphthenyl group, a fluorenyl group, a phenatolyl group, an indenyl group, a pyrenyl group, and a biphenyl group), an aromatic heterocyclyl group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazolyl group, and a phthalazyl group), a heterocyclyl group (for example, a pyrrolidyl group, an imidazolydyl group, a morpholyl group, and an oxazolydyl group), an alkoxy group for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amide group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), a ureide group (for example, a methylureide group, an ethylureide group, a pentylureide group, a cyclohexylureide group, an octylureide group, a dodecylureide group, a phenylureide group, a naphthylureide group, and a 2-pyridylaminoureide group), a sulfinyl group (for example, a methylsulfonyl group, an ethylsulfonyl group, a butylsulfonyl group, a cyclohexylsulfinyl group, a 2-ethylhexylsulfinyl group, a dodecylsulfinyl group, a phenylsulfonyl.group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group), a cyano group, a silyl group (for example, a trimethylsilyl group, a triisopropylsilyl group, a triphenylsilyl group, and a phenyldiethylsilyl group).

These substituents may further be substituted with the above substituents, and a plurality of the above substituents may combine with each other to form a ring.

Of these, the preferred substituent is an alkyl group, the more preferred one is an alkyl group having 2 to 20 carbon atoms, and the most preferred one is an alkyl group having 6 to 12 carbon atoms.

It is preferable that the terminal group of the thiophene oligomers employed in the present invention has no thienyl group. Listed as preferred groups in the above terminal group are an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group); an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); and a halogen atom (for example, a fluorine atom, a chlorine atom, and a bromine atom).

Typical examples of the compound comprising a partial structure represented by formula (1) include exemplified compounds <1> through <22> as disclosed in Japanese Patent O.P.I. Publication No. 2006-216654.

The organic semiconductor layer 7 may be subjected to a so-called doping treatment which incorporates materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopatt. As the dopant in the used present invention, a known dopant can be used.

The organic semiconductor layer 7 can be formed via methods known in the art, including, for example, vacuum deposition, CVD (Chemical Vapor Deposition), laser deposition, electron beam deposition, a spin coating method, a dip coating method, a bar coating method, a die coating method, and a spray coating method, as well as methods such as screen printing, ink-jet printing and blade coating.

As patterning of the organic semiconductor layer, there is mentioned patterning according to a vacuum deposition method employing a mask (when a vacuum deposition method is used), patterning by photolithography treatment (applied to an organic semiconductor layer formed over whole area) or direct patterning such as an ink jet printing method.

The thickness of the organic semiconductor layer 7 is not specifically limited. Properties of the obtained transistor tend to depend significantly on the thickness of the organic semiconductor layer. The thickness is ordinarily at most 1 µm, and preferably from 10 to 300 nm, although it is different depending on kinds of the organic semiconductor.

The passivation layer 8 or 9 may be composed only of an organic layer or only of an inorganic layer. The passivation layer is preferably composed of a lamination layer of an organic layer and an inorganic layer. Materials usable for the organic layer are preferably those having no adverse effect on the organic semiconductor. Examples thereof include polyvinyl alcohol, polyvinyl pyrrolidone, and a homopolymer or a copolymer composed of a component such as HEMA, acrylic acid or acrylamide. Employing an aqueous solution containing these materials, the organic layer can be formed according to a coating method such as a spray coating method, a spin coating method, a blade coating method or a dip coating method or a patterning method such as a printing method or an ink-jet method.

Employing inorganic oxides or nitrides such as silicon dioxide, silicon nitride, aluminum oxide, tantalum oxide, and titanium oxide, the inorganic layer can be formed according to an atmospheric pressure plasma method, a vacuum deposition method, a molecular beam epitaxial growth method, an ion cluster beam method, a low energy ion beam method, an ion plating method, a CVD method, and a sputtering method; a coating method such as a spray coating method, a spin coating method, a blade coating method or a dip coating method; or a patterning method such as a printing method or an ink-jet method.

EXAMPLES

Next, the present invention will be explained employing examples, but is not specifically limited thereto.

Example 1

A layer of an aluminum-neodymium (AlNd) as an aluminum alloy was formed on a glass substrate 1 employing a sputtering method to give a thickness of 150 nm. The AlNd layer was subjected to photolithography treatment and etching treatment to form a gate electrode 2 and a contact electrode 3.

Subsequently, a SiO$_2$ layer with a thickness of 300 nm was formed employing a plasma CVD method, whereby a gate insulating layer 4 was formed.

The surface of the resulting gate insulating layer 4 was subjected to UV ozone treatment. The resulting material was immersed in an ethanol solution containing 5 mmol of Exemplified compound (A-2) for 2 hours, and dried at 120° C. for one hour to evaporate the ethanol. The resulting material was exposed to UV light through a mask having an opening at areas where a source electrode and a drain electrode were to be formed, immersed in a Pd catalyst solution, dried, immersed in an electroless gold plating solution, and dried to form a source electrode 5 and a drain electrode 6 each comprised of-gold according to the mask pattern.

A solution of 6,13-bistriisopropylsilylethynyl pentacene (hereinafter also referred to simply as pentacene) as an organic semiconductor material solution was applied on the center of each of the source electrode 5 and the drain electrode 6 employing an ink jet method, whereby an organic semiconductor layer 7 was formed to cover the source and drain electrodes. The applied amount of the pentacene solution was such an amount that the thickness of the dried organic semiconductor layer 7 was about 50 nm, the amount pre-determined according to pre-experiments.

Subsequently, a layer of PVA 124C (trade name, produced by Kuraray Co., Ltd., light insensitive polyvinyl alcohol resin) as a passivation layer 8 was formed employing a spin coating method to give a thickness of about 2 μm, and subjected to photolithography treatment and etching treatment to remove unnecessary areas, whereby the passivation layer 8 was formed.

Subsequently, a SiO$_2$ passivation layer 9 with a thickness of 50 nm was formed employing an atmospheric pressure plasma method.

Subsequently, a layer of PC 403 (trade name, produced by JSR Nippon Gosei Gomu Co., Ltd.,) as a light sensitive insulating layer 10 was coated on the passivation layer 9 to give a thickness of about 1 μm. The resulting material with the PC 403 layer as a resist was subjected to photolithography treatment (exposure and development), whereby a contact hole for connecting the drain electrode 6 to a pixel electrode 11 described later was formed. Specifically, the resulting material was subjected to exposure through a mask and development to remove the PC 403 of the light sensitive insulating layer 10 of the contact hole area, and washed with water to remove the PVA 124C of the passivation layer revealed, whereby a part of the drain electrode was revealed.

Subsequently, an ITO (Indium Tin Oxide) layer for a pixel electrode 11 was deposited at a thickness of 150 nm according to a sputtering method, and subjected to photolithography treatment and etching treatment, whereby a contact electrode 15 and a pixel electrode 11 are formed. Thus, an organic thin film transistor 1 was prepared.

It has proved that the organic thin film transistor 1 obtained above, operated according to a conventional method, provides operation with a good switching property.

Example 2

A glass substrate 1 subjected to a UV/ozone treatment was immersed in an-ethanol solution containing 5 mmol of Exemplified compound (A-1) for 2 hours, and dried at 120° C. for one hour to evaporate ethanol.

The resulting material was exposed to UV light through a mask having an opening at areas where a gate electrode and a contact electrode are to be formed, immersed in a Pd catalyst solution, dried, immersed in a 0.1 mol/l chromium electroless plating solution, and dried to form a gate electrode 2 and a contact electrode 3 each comprised of chromium according to the mask.

Subsequently, a SiO$_2$ layer with a thickness of 300 nm was formed employing a plasma CVD method, whereby a gate insulating layer 4 was formed.

Subsequently, a resist pattern was provided on the insulating layer 4 according to photolithography treatment and etching treatment in order to form a source electrode and a drain electrode according to a lift-off method.

Subsequently, a chromium layer with a thickness of 5 nm was formed on the resist pattern as a layer for forming a source electrode and a drain electrode, and further, a gold layer with a thickness of 50 nm was deposited on the chromium layer according to a sputtering method. Thereafter, the resist pattern was removed with a resist remover to form a source electrode 5 and a drain electrode 6.

An organic semiconductor material solution, a solution of 6,13-bistriisopropylsilylethynyl pentacene was applied onto the center of each of the source electrode 5 and drain electrode 6 via an ink jet method, whereby an organic semiconductor layer 7 was formed so as to cover the source and drain electrodes. The applied amount of the pentacene solution was such an amount that the thickness of the dried organic semiconductor layer 7 was about 50 nm, the amount pre-determined according to pre-experiments.

Subsequently, a layer of PVA 124C (trade name, produced by Kuraray Co., Ltd., light insensitive polyvinyl alcohol resin) as a passivation layer 8 was formed employing a spin coating method to give a thickness of about 2 μm, and subjected to photolithography treatment and etching treatment to remove unnecessary areas, whereby the passivation layer 8 was formed.

Subsequently, a SiO$_2$ passivation layer 9 with a thickness of 50 nm was formed employing an atmospheric pressure plasma method.

Subsequently, a layer of PC 403 (trade name, produced by JSR Nippon Gosei Gomu Co., Ltd.,) as a light sensitive insulating layer 10 was coated on the passivation layer 9 to give a thickness of about 1 μm. The resulting material with the PC 403 layer as a resist was subjected to photolithography treatment (exposure and development), whereby a contact hole for connecting the drain electrode 6 to a pixel electrode 11 was formed. Specifically, the resulting material was subjected to exposure through a mask and development to remove the PC 403 of the light sensitive insulating layer 10 of the contact hole area, and-washed with water to remove the PVA 124C of the passivation layer revealed, whereby a part of the drain electrode was revealed.

Subsequently, an ITO (Indium Tin Oxide) layer for a pixel electrode 11 was deposited at a thickness of 150 nm according to a sputtering method, and subjected to photolithography treatment and etching treatment, whereby a contact electrode 15 and a pixel electrode 11 were formed. Thus, an organic thin film transistor 2 was prepared.

It has proved that the organic thin film transistor 2 obtained above, operated according to a conventional method, provides operation with a good switching property.

Example 3

An aluminum alloy, an aluminum-neodymium (AlNd) layer was formed on a glass substrate 1 employing a sputtering method to give a thickness of 150 nm. The AlNd layer was subjected to photolithography treatment and etching treatment to form a gate electrode 2 and a contact electrode 3.

Subsequently, a SiO$_2$ layer with a thickness of 300 nm was formed employing a plasma CVD method, whereby a gate insulating layer 4 was formed.

Subsequently, a resist pattern was provided on the insulating layer 4 according to photolithography treatment and etching treatment in order to form a source electrode and a drain electrode according to a lift-off method.

Subsequently, a chromium layer with a thickness of 5 nm was formed on the resist pattern in order to form a source electrode and a drain electrode, and further, a gold layer with a thickness of 50 nm was deposited on the chromium layer according to a sputtering method. Thereafter, the resist pattern was removed with a resist remover to form a source electrode 5 and a drain electrode 6.

An organic semiconductor material solution, a solution of 6,13-bistriisopropylsilylethynyl pentacene was applied onto the center of each of the source electrode 5 and drain electrode 6 via an ink jet method, whereby an organic semiconductor layer 7 was formed so as to cover the source and drain electrodes. The applied amount of the pentacene solution was such an amount that the thickness of the dried organic semiconductor layer 7 was about 50 nm, the amount pre-determined according to pre-experiments.

Subsequently, a layer of PVA 124C (trade name, produced by Kuraray Co., Ltd., light insensitive polyvinyl alcohol resin) as a passivation layer 8 was formed employing a spin coating method to give a thickness of about 2 μm, and subjected to photolithography treatment and etching treatment to remove unnecessary areas, whereby the passivation layer 8 was formed.

Subsequently, a SiO$_2$ passivation layer 9 with a thickness of 50 nm was formed employing an atmospheric pressure plasma method.

Subsequently, a layer of PC 403 (trade name, produced by JSR Nippon Gosei Gomu Co., Ltd.,) as a light sensitive insulating layer 10 was coated on the passivation layer 9 to give a thickness of about 1 μm. The resulting material with the PC 403 layer as a resist was subjected to photolithography treatment (exposure and development), whereby a contact hole for connecting the drain electrode 6 to a pixel electrode 11 was formed. Specifically, the resulting material was subjected to exposure through a mask and development to remove the PC 403 of the light sensitive insulating layer 10 of the contact hole area, and washed with water to remove the PVA 124C of the passivation layer revealed, whereby a part of the drain electrode was revealed.

Subsequently, in order to form a pixel electrode 11, the surface of the light sensitive insulating layer 10 was subjected to UV ozone treatment. The resulting material was immersed in an ethanol solution containing 5 mmol of Exemplified compound (A-3) for 2 hours, and dried at 120° C. for one hour to evaporate the ethanol. The resulting material was exposed to UV light through a mask having an opening at areas where the pixel electrode 11 was to be formed, immersed in a Pd catalyst solution, dried, immersed in an electroless silver plating solution, and dried to form a pixel electrode 11 comprised of silver according to the mask pattern. Thus, an organic thin film transistor 3 was prepared.

It has proved that the organic thin film transistor 3 obtained above, operated according to a conventional method, provides operation with a good switching property.

As is described in Examples 1 through 3 above, an organic thin film transistor employing the compound represented by formula (I) in the invention can be manufactured by a simple method and can provide the same performance as an organic thin film transistor manufactured according to a sputtering method. Particularly, it has proved that performance of an organic thin film transistor, in which the source and drain electrodes are formed employing a compound represented by formula (I), is greatly improved.

The invention claimed is:

1. An organic thin film transistor comprising a substrate and provided thereon, a source electrode, a drain electrode, an organic semiconductor connecting the source electrode and the drain electrode, a gate electrode, and an insulating layer composed of a plurality of layers, the insulating layer being provided between the gate electrode and the organic semiconductor, wherein the organic thin film transistor comprises a mercapto group-containing compound represented by the following formula (I),

(R)$_n$—Si(A)$_{3-n}$-(B)  Formula (I)

wherein R represents an alkyl group having a carbon atom number of not more than 8; A represents an alkoxy group or a halogen atom; B represents a substituent containing an SH group; and n is an integer of from 0 to 2, and wherein the substituent represented by B in formula (I) has a triazine ring.

2. The organic thin film transistor of claim 1, further comprising a pixel electrode and/or a contact electrode, wherein at least one electrode selected from the pixel electrode, the source electrode, the drain electrode, the gate electrode and the contact electrode is formed from a layer composed of the mercapto group-containing compound and a layer composed of a metal.

3. The organic thin film transistor of claim 1, wherein the organic semiconductor contains a compound having a partial structure represented by the following formula (1),

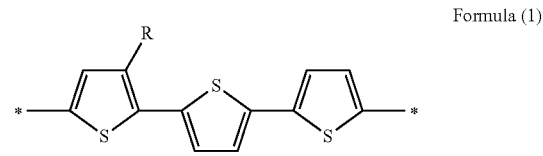

Formula (1)

wherein R represents a substituent.

4. A process for manufacturing an organic thin film transistor comprising a substrate and provided thereon, a source electrode, a drain electrode, an organic semiconductor connecting the source electrode and the drain electrode, a gate electrode, and an insulating layer composed of a plurality of layers, the insulating layer being provided between the gate electrode and the organic semiconductor, the process comprising the step of bringing a base material into contact with a solution containing a mercapto group-containing compound represented by the following formula (I) to form a layer containing the mercapto group-containing compound where the compound combines with the base material through a siloxane bond,

(R)$_n$—Si(A)$_{3-n}$-(B)  Formula (I)

wherein R represents an alkyl group having a carbon atom number of not more than 8; A represents an alkoxy group or a halogen atom; B represents a substituent containing an SH group; and n is an integer of from 0 to 2 and
 exposing to light the layer containing the mercapto group-containing compound to form first areas capable of combining with a metal and second areas incapable of combining with a metal, the first and second areas being separated from each other.

5. The process for manufacturing an organic thin film transistor of claim 4, wherein the first areas have on the surface an —SH group, and the second areas have on the surface an —S—S— bond.

6. The process for manufacturing an organic thin film transistor of claim 4, the process further comprising the step of bringing the exposed layer into contact with a solution containing a metal to combine the metal with the first areas capable of combining with a metal.

7. The process for manufacturing an organic thin film transistor of claim 4, the process further comprising the step of bringing the exposed layer into contact with a solution containing a metal, followed by plating treatment, whereby a plating film is formed at the exposed portions.

8. An organic thin film transistor manufactured according to the process for manufacturing an organic thin film transistor of claim 4.

* * * * *